United States Patent [19]

Fleetwood

[11] Patent Number: 4,739,262
[45] Date of Patent: Apr. 19, 1988

[54] METHOD FOR REMOVAL OF BIAS DIFFERENCE BETWEEN MAGNETOMETERS

[75] Inventor: James M. Fleetwood, Carrollton, Tex.

[73] Assignee: Mobil Oil Corporation, New York, N.Y.

[21] Appl. No.: 97,303

[22] Filed: Sep. 14, 1987

Related U.S. Application Data

[63] Continuation of Ser. No. 412,045, Aug. 26, 1982, abandoned.

[51] Int. Cl.$^4$ .................... G01R 33/24; G01V 3/38; G01V 3/40
[52] U.S. Cl. .................... 324/245; 324/244
[58] Field of Search .............. 324/77 R, 350, 244, 324/245, 250, 251, 252, 253, 254, 255, 256, 260, 261, 330, 331, 347, 348, 246, 247, 248, 249, 257, 258, 259; 364/457, 570, 571

[56] References Cited

U.S. PATENT DOCUMENTS

| | | | |
|---|---|---|---|
| 3,418,568 | 12/1968 | Hearn | 324/331 X |
| 3,541,458 | 11/1970 | Klund | 324/77 R |
| 3,757,203 | 9/1973 | Salvi et al. | 324/331 |
| 4,286,218 | 8/1981 | Bloomquist et al. | 324/350 |

Primary Examiner—Reinhard J. Eisenzopf
Assistant Examiner—Warren S. Edmonds
Attorney, Agent, or Firm—Alexander J. McKillop; Michael G. Gilman; George W. Hager, Jr.

[57] ABSTRACT

A method for removing bias difference between two or more similarly operated magnetometers is disclosed wherein the inherent bias difference due to the magnetic field of the towing vessel is removed without determining its relative magnitude. Magnetic data is gathered and all time related magnetic events except bias level and slope of the time related magnetic events are removed by mathematical adjustment. Point by point statistical analysis is performed to remove the bias level and the time related slope.

3 Claims, 1 Drawing Sheet

METHOD FOR REMOVAL OF BIAS DIFFERENCE BETWEEN MAGNETOMETERS

This is a continuation of copending application Ser. No. 412,045, filed on Aug. 26, 1982, now abandoned.

BACKGROUND OF THE INVENTION

The present invention pertains to marine data acquisition system and more particularly to a method for accurately determining the horizontal magnetic gradient of the earth's field between two known locations.

The value of a method for determining the horizontal magnetic gradient of the earth's field between two known locations is that temporal anomalies could be detected directly from the data set, eliminating the need for a base magnetometer that is normally located onshore some distance from the actual area of interest. The base magnetometer must be monitored by shore personnel and the difference in locations between the area of interest and the base magnetometer can cause problems in itself. This stems from the fact that although the diurnal variation is apporxoimately the same at the same solar time at different points, it differs in detail.

Such a system is offered but past attempts to process the data have shown that the system is influenced by the presence of the ship. Analysis of the data indicates that a bias difference between the two magnetometers exists and varies with heading.

To mathematically compute this bias difference is an impossible task. Any attempt to do so quickly reveals that there are more variables to be solved for than equations. The solution is non-unique.

A gradiometer system can basically be thought of simply as two magnetometers that operate and measure the earth's total intensity magnetic field independently of each other. FIG. 1 illustrates the present configuration of a typical gradiometer system. A magnetometer 12 being towed 1500 feet aft of a marine vessel 14 is referred to as the near magnetometer. A magnetometer 16 being towed 2000 feet aft of marine vessel 14 is referred to as the far magnetometer. Both magnetometers 12 and 16 are sampled simultaneously.

Temporal variations are magnetic anomalies that are functions of time, and over relatively short distances, it can be assumed that their effects are everywhere equal in magnitude and phase at any one moment. Temporal variations can be caused by any number of sources such as radio transmission emanating from the ship, magnetic storms, or diurnal variations that are somewhat cyclic in nature, and constitute the bulk of the temporal variations on most days.

Temporal variations affect both magnetometers equally at the same moment, so any difference in magnitude of the two sensors should be due directly to the horizontal gradient of the earth's field between their locations. By subtracting simultaneous readings measured by the sensors and properly integrating the results, the earth's field minus temporal variations can be computed.

The problem is that due to the near proximity of the ship, its magnetic field (induced and/or due to electric currents in the steel construction) affects both sensors. Because the distances between each sensor and the ship are different, the effects of the ship are not equal relative to each sensor. The result manifests itself as a bias difference between the two sensors. It can be safely assumed that the ship's magnetic field remains relatively constant with constant heading, but problems arise when heading changes reposition the magnetometers relative to the ship's field. The vector of the ship's field changes direction relative to the sensors and the differences between the old and new resultants can change the magnitude and sign of the bias difference.

The earth's magnetic field is a vector quantity with an average magnitude in the neighborhood of 45,000 gammas. General changes in the magnitude and direction of this vector occur slowly over distances of several hundred miles or more. Local anomalies can vary in magnitude by several hundred gammas, which represent a small percentage of this total. From this, it can be assumed that the varying bias difference between sensors is not due to the ship's interaction with the earth's regional field and that local anomalies have little effect. As long as the ship remains on a constant heading, the bias difference will remain relatively constant over distances of many miles. The magnitude of the bias difference cannot be determined for any one moment in time.

FIG. 2 illustrates the bias difference due to the field induced by vessel 14. In this figure it is assumed that vessel 14 is symmetrical and homogeneous. As illustrated, the values of near magnetometer 12 and far magnetometer 16 are approximately equal when vessel 14 is headed due East or due West. When vessel 14 is headed due North, the value indicated by near magnetometer 12 is greater than that of far magnetometer 16 while when vessel 14 is headed due South the value indicated by near magnetometer 12 is less than that of far magnetometer 16. Since marine vessels are never center point symmetrical and homogeneous and a course heading for magnetometer 12 and 16 of exactly due West or due East is rare because of subsea inconsistencies such as currents, wave action, etc., there is always a bias difference between near magnetometer 12 and far magnetometer 16.

SUMMARY OF THE INVENTION

The present invention provides a method for removing the bias difference between two or more magnetometers including obtaining two sets of magnetic data on a time base, one from a near magnetometer and one from a far magnetometer, changing the base from time to distance, resampling the data from the far magnetometer to obtain data at the same distance coordinate as the near magnetometer, subtracting the values of the near magnetometer from the values of the far magnetometer at corresponding coordinates, integrating the differences to obtain a diurnal variation with a slope, adjusting the slope so that the first and last data points are equal, subtracting the diurnal variation with adjusted slope value from the original far magnetometer data, computing the slope of the result, equating the slope of the far magnetometer with the slope of the computed data, repeating the foregoing steps for an additional group of two sets of magnetic data which intersects the first group, performing a least squares fit to the intersection points of the two groups and adjusting the intersect differences to obtain a minimum error. In an alternate embodiment, the obtained magnetic data is left in a time base before integration, resampling the data to common coordinates is unnecessary.

DESCRIPTION OF THE PREFERRED EMBODIMENT

Figure 1:
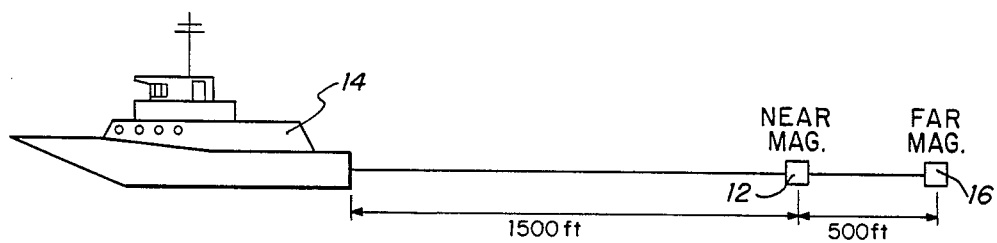
FIG. 1 illustrates a data acquistion system used in accordance with the present invention to determine the Earths horizontal magnetic gradient along a marine line of exploration.
Figure 2:
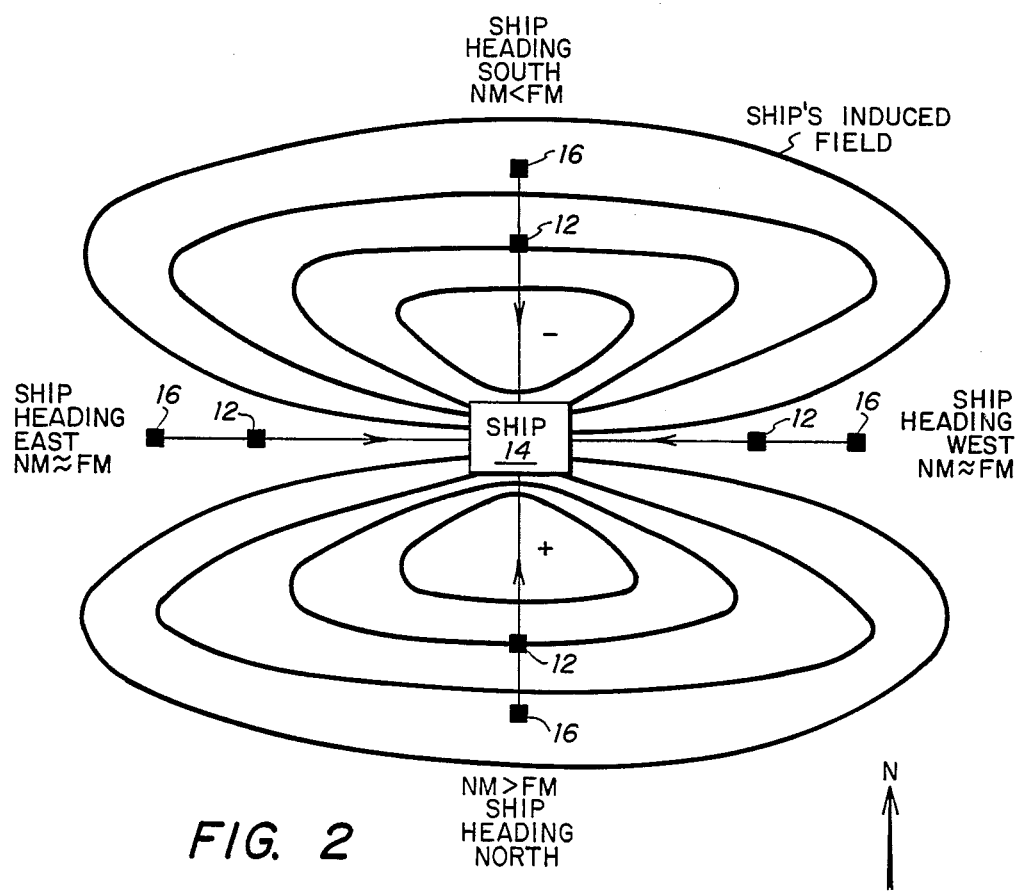
FIG. 2 illustrates the magnetic bias difference between the two magnetometers of FIG. 1 due to the field induced by the towing vessel.

Assuming the bias difference remains constant as long as the heading remains constant, it appears possible to average the readings of each magnetometer independently, and subtract these averages to determine this bias difference. Unfortunately, the determined bias difference does not coincide with reality because the earth's field measured by each sensor differs spatially by an amount equal to the distance between the two sensors. This difference, however, could be removed by averaging values of both magnetometers over the common cooridnates.

If the temporal variations are included, resampling one of the sensors to remove this spatial difference would not solve the problem, for resampling would create an apparent spatial difference in the temporal variations, and the same type of problem would exist. It cannot be determined in a real situation how much of this number is due to a difference in averages of the earth's field and/or temporal variations, and how much is due to an actual bias difference beween magnetometers.

Using the foregoing assumptions, a simple model can be defined. Attempts at the computation of the earth's field directly, result in an unknown linear error. The linear error cannot be determined, and the result is of marginal value because of the possibility of the error doing more harm than good. The present invention allows the computation of the temporal variations. It too will have a linear error, but it can be adjusted mathematically so that the final results have exactly the same linear error as found in the raw data. The final linear error is still unknown, but since the raw data contains the same error, it can be treated using conventional processing techniques. A method of linear adjustments based on intersection values is then presented.

The following definitions will apply:
$M_1$ = Far magnetometer reading
$M_2$ = Near magnetometer reading
$S$ = Distance between magnetometers
$H$ = Earth's magnetic field
$D$ = Temporal variations
$B_1$ = Bias of far magnetometer
$B_2$ = Bias of near magnetometer
$X$ = Distance from beginning of line For simplicity, the spatial domain will be used entirely. Using the above definitions the simultaneous sampling of $M_1$ and $M_2$ can be defined as:

$$M_1(X) = H(X) + D(X) + B_1 \tag{1}$$

$$M_2(X+S) = H(X+S) + D(X+S) + B_2 \tag{2}$$

Since $D(X)$ and $D(X+S)$ are considered functions of time rather than distance, it is true that $$D(X+S) = D(X)$$

and $M_1(X)$ and $M_2(X+S)$ can be redifined before resampling as $$M_1(X) = h(X) + h_T(X) + d(X+S) + d_T(X+S) + B_1 \tag{3}$$

$$M_2(X+S) = h(X+S) + h_T(X+S) + d(X+S) + d_T(X+S) + B_2 \tag{4}$$

where
$H(X) + h_T(X)$
$h_T(X)$ = Unknown slope component of $H(X)$
$h(X)$ = All other components (including remainder of slope component of $H(X)$ which can be determined.)
$D(X+S) = D(X+S) + D_T(X+S)$
$d_T(X+S)$ = Unknown slope component of $D(X)$.
$d(X+S)$ = All other components (including remainder of slope component of $D(X)$ which can be determined.) There are no differences between the original equations and these, except we have chosen to change the notation involving the temporal variations to an equivalent form in order to prevent confusion as to their phase relationships By shifting equation 3 by an amount S and subtracting $M_2(X+S)$ from $M_1(X+S)$ yields $$M_1(X+S) = h(X+S) + h_T(X+S) +$$
$$d(X+2S) + d_T(X+2S) + B_1$$

$$(-) M_2(X+S) = h(X+S) + h_T(X+S) +$$
$$d(X+S) + d_T(X+S) + B_2$$

$$M_1(X+S) - M_2(X+S) = d(X+2S) - \tag{5}$$
$$d(X+S) + d_T(X+2S) - d_T(X+S) + B_1 - B_2$$

(Note that $d(X+2S) + d_T(X+2S)\ d(X+S) + d_T(X+S)$)

Averaging $M_1(X+S)$ and $M_2(X+S)$ and subtracting $M_2(X+S)$ from $M_1(X+S)$ yields $$M_1(X+S) = h(X+S) + h_T(X+S) +$$
$$d(X+2S) + d_T(X+2s) + B_1$$

$$(-)\ M_2(X+S) = h(X+S) + h_T(X+S) +$$
$$d(X+S) + d_T(X+S) + B_2$$

$$M_1(X+S) - M_2(X+S) = d(X+2S) - \tag{6}$$
$$d(X+S) + d_T(X+2S) - d_T(X+S) + B_1 - B_2$$

The following equalities will be assumed to hold:

$$B_1 = B_1$$

$$B_2 = B_2$$

$$d(X+2S) - d(X+S) = 0$$

$$d_{TE}(x) = (d(X+2S) - d_T(X+S)) - (d_T(X+2S) - d_T(X+S))$$

($d_{TE}(X)$ can be determined directly.)

Rewriting equation 6 and subtracting it from equation 5 yields $$M_1(X + S) - M_2(X + S) = d(X + 2S) - d(X + S) +$$

$$(d_T(X + 2S) - d_T(X + S)) + B_1 - B_2$$

$$(-) \; M_1(X + S) - M_2(X + S) =$$

$$(d_T(X + 2S) - d_T(X + S)) + B_1 - B_2$$

$$M_1(X + S) - M_1(X + S) - M_2(X + S) + \quad (7)$$

$$M_2(X + S) = d(X + 2S) - d(X + S) + d_{TE}(X)$$

The bias difference has been removed, but we are missing a linear component $d_T$ of $D(X)$. It can be assumed that this missing component will be somewhat randomly oriented throughout the survey as a whole.

Recapping our situation, we can derive two equations that allow the computation of $h(X)$ and $d(X)$:

$$M_1(X) - \overline{M_1(X)} - M_2(X+S) + \overline{M_2(X+S)} - h_{TE}(X) = h(X) - h(X+S) \quad (8)$$

$$M_1(X+S) - \overline{M_1(X+S)} - M_2(X+S) + \overline{M_2(X+S)} - d_{TE}(X) = d(X2S) - d(X+S) \quad (9)$$

Both distort the outputs ($H(X)$ and $D(X)$ (after integration)) to some degree, but this distortion has allowed the removal of the bias difference that has plagued the system. Polynomial representations of $d(X)$ and $h(X)$ are:

$$h(X) = a_0 + a''_1 X + a_2 X^2 + \ldots + a_N X^N$$

$$h_T(X) = a'_1 X$$

and $$d(X) = b_0 + b''_1 X + b_2 X^2 + \ldots + b_N X^N$$

$$d_T(X) = b'_1 X$$

When the integration is performed on equation 9 to determine $d(X)$, the constant $b_0$ is unknown and cannot be determined; therefore, a new definition is in order. We will start the integration at zero and define:

$$d_0(X) = b''_1 X + b_2 X^2 + \ldots + b_N X^N \quad (10)$$

We can define $a''_1 X$ and $b''_1 X$ as $$a''_1 X = a_1 X - a'_1 X$$

$$b''_1 X = b_1 X - b'_1 X \quad (11)$$

The components $a''_1 X$ and $b''_1 X$ can easily be evaluated by simply computing the slope of $h(X)$ and $d(X)$. We defined $M_1(X)$ as $$M_1(X) = h(X) + h_T(X) + d(X) + d_T(X) + B_1$$

or $$M_1(X) = H(X) + d(X) + d_T(X) + B_1$$

A polynomial representation of $M_1(X)$ is $$M_1(X) = a_0 + b_0 + a_1 X + b'_1 X + b''_1 X + a_2 X^2 + b_2 X^2 + \ldots + a_N X^N + b_N X^N + B_1 \quad (12)$$

Subtracting equation 10 from 12 yields $$M_1(X) - d_0(X) = a_0 + b_0 + a_1 X + b'_1 X + a_2 X^2 + \ldots + a_n X^N + B_1 \quad (13)$$

By adding equation 11 to 13 we achieve $$M_1(X) - d_0(X) + b''_1 X = a_0 + b_0 + a_1 X + b_1 X + a_2 X^2 + \ldots + a_N X^N + B_1 = H(X) + b_0 + b_1 X + B_1 \quad (14)$$

Equation 14 represents our final answer. We have achieved the following:

1. We have eliminated all components of the temporal variation except its original slope $b_1$ and its d.c. level $b_0$. The fact that they still remain is of no real concern. Because they exist in the raw data, they represent a problem that has had to be handled through conventional processing for many years.

2. We have eliminated the bias difference that plagued the integration without having to determine its magnitude. This was our prime concern at the beginning.

The fact that the bias level $B_1$ still remains in the data is also of no real concern. Again, it existed in the raw data. The components $b_0$ and $B_1$ can be eliminated through use of a systematic adjustment routine based on intersection values.

Since the survey is not run with a dependency on time, $b_1 X$ will tend towards randomness as far as its distribution throughout the survey is concerned. A comparison of the magnitudes of $b_1$ and $B_1 = B_2$ is needed to eliminate any concern as to which error is the larger of the two.

A general limit of the magnitude of $b_1$ can be determined through observation. Observatories throughout the world monitor diurnal variations on a continuous basis. It has been determined that the diurnal variation rarely exceeds 100 gammas over a 24-hour period, and is more commonly in the range of 10 to 30 gammas.

It is not within our means to compute the magnitude of the bis difference involved in any particular line, but equation 6 allows at least a rough estimate of the magnitude of $B_1 - B_2$ relative to at least four particular headings. By computing these averages on a line by line basis, and averaging the results of lines with the same general heading, an estimate of the bias difference might be achieved, providing that enough randomness exists in the temporal variations involved in equation 6.

Equation 14 allows us to at least control the situation to a considerable degree, but an attack is needed that will help eliminate the remaining errors of $b_0$, $b_1$ and $B_1$. Further mathematical derivations will lead nowhere, so a statistical approach becomes necessary. Before attempting to eliminate $b_0$ and $b_1$, a discussion of the error $b_0$ is necessary.

Although the term diurnal implies that a cyclic variation occurs daily, there are also lower frequency components of significant magnitude involved. These components can have periods greater than 24 hours and extend into the range of years. Because of these lower frequency components, a line of data collected over a particular span of time can have an average value that is higher or lower by possibly several gammas or greater than a repeat line taken over a different span of time, and as mentioned, $b_0$ cannot be determined before integration takes place. As a result, the integration must start at zero.

The error we are seeking to remove is $$ERROR = (b_0 + B_1) + b_1 X \quad (15)$$

Equation 15 cannot be evaluated, but its basic form suggests that given some reference to compare with, then a simple zero and first order adjustment will suffice. The only references available other than possibly some procedure involving parallel lines are tie line intersections. By computing a zero and first order best fit polynomial to the values of the tie lines relative to the beginning of the line in question, and adjusting the line by an amount equal to the difference between the line's zero and first order best fit polynomial and that of the intersecting tie lines, and repeating this process on all lines and iteratively on the survey as a whole, the survey should converge to the point to where the RMS error of all intersections is at a minimum.

A simple and readily available equation that can be used in such a procedure is the slope-intercept equation $$Y = \overline{Y} + m(X - \overline{X})$$

where $$\overline{X} = \frac{X_1 + X_2 + \ldots + X_N}{N}$$

$$\overline{Y} = \frac{Y_1 + Y_2 + \ldots + Y_N}{N}$$

$$m = \frac{(X_1 Y_1 + X_2 Y_2 + \ldots + X_N Y_N) - N \overline{X} \overline{Y}}{(X_1^2 + X_2^2 + \ldots + X_N^2) - N \overline{X}^2}$$

It must be kept in mind that the final outcome is influenced by all lines within the survey, and not just the particular tie lines involved with the line to be adjusted. Each iteration adjusts each line according to the values computed after adjustment of the tie lines during the previous iteration. Effectively, lines not directly associated with the line being adjusted in the above figures have had a substantial influence.

Two possible errors can occur using the above algorithm, but statistically speaking, these errors can occur in any magnetic survey regardless of how it has been processed. The first error involves possible poor distributions of $b_0$ and $B_1$ relative to the survey as a whole. The outcome of this poor distribution would be to effectively change the average value of the survey. Unless the survey was repeated many times and averaged, or unless a reference station was available for comparison, the magnitude of this error cannot be determined.

The second error is similar, but will tilt the plane of the survey. This can be caused by a poor distribution of $b_1 X$ if equation 14 has been used, the fact that $a_1'$ can be missing, or by $b_0$ or $B_1$ being on the average higher or lower on one side of the survey relative to the other.

Both errors are not of a serious nature, and the possibility of their presence has always existed. Using the present methods for computing regional corrections, the errors do not exist in the residual data.

At this point the bias difference between both sensors has been removed and through the use of the above algorithm, the remaining error has been substantially reduced. At this time a third error has been making its presence known, but has not been properly analyzed. The error consists of a low frequency distortion in $h(X)$ and the cause is unknown. It was first observed when repeat lines became available and indications are that it can be significant if not properly removed. Because of its low frequency nature, the random error routine of program NTRSECT (Z2163) does quite well in removing the error as long as a sufficient distribution of intersections exists.

As mentioned, the source of the error is unknown but is probably a combination of factors. The most obvious choice would be that the assumption that the bias difference between sensors remains constant with constant heading is in error, but cross currents causing the far magnetometer to not track the near magnetometer would be just as valid an argument. Another source might be rotational patterns involving the sensors and caused by tension differences in the cable occurring at different times.

The most pronounced characteristic of the error is its low frequency nature, and unless aliasing is involved, this eliminates higher frequency sources such as surface wave action and sensor wobble.

Basically, the program uses equation 14 in its effort to compute the earth's field. As mentioned, equation 14 allows some randomness to exist within the survey, thus minimizing the error in the tilt of the plane of the survey. There also exists a despiking routine and filtering operation that attempts to clean up the navigation updates and inconsistencies. The program also adjusts the navigation so that it corresponds to the far magnetometer rather than the ship. Once the temporal variations have been computed, they are subtracted from the far magnetometer only and output for linear adjustment.

What is claimed is:

1. A method for determining the earth's horizontal magnetic gradient between two earth coordinate points during a marine exploration survey of variable magnetic headings, comprising the steps of:
   (a) traversing the earth's surface with a marine vessel towing first and second magnetometers spaced apart along a line of exploration for measuring the earth's magnetic gradient;
   (b) obtaining a first survey line of magnetic data having two sets of magnetic data on a time base;
   (c) changing said two sets of magnetic data on said time base to a distance base;
   (d) resampling said distance base set of one set of magnetic data to obtain two sets of magnetic data corresponding to each data point sampled;
   (e) subtracting the value of one set of magnetic data from the value of another set of magnetic data to obtain the difference;
   (f) integrating said difference to obtain a diurnal variation;
   (g) adjusting the slope of said diurnal variation to equate the first and last data points of said diurnal variation;
   (h) subtracting said diurnal variation from said other set of magnetic data to obtain a third set of data; and
   (i) equating the slope of said third set of data to the slope of said other set of magnetic data to obtain a first modified set of data;
   (j) obtaining a second survey line of magnetic data intersecting said first survey line of magnetic data, said second line having a first set and a second set of magnetic data, each on a time base;
   (k) changing said first set and said second set of magnetic data to a distance base;

(l) resampling said first set and said second set of magnetic data on said distance base to obtain a first value and a second value of magnetic data for each data point sampled;

(m) subtracting said first value from said second value to obtain a set of difference values one corresponding to each data point sampled;

(n) integrating said set of difference values to obtain a variation value;

(o) subtracting said variation value from said second value for each data point sampled to obtain an adjusted set of data;

(p) equating the slope of said adjusted set of data to the slope of said second value to obtain a second modified set of data;

(q) performing a least squares fit to values of said first modified set of data and said second modified set of data; and (r) adjusting intersection differences between said first modified set of data and said second modified set of data to obtain a minimum error.

2. A method for determining the earth's horizontal magnetic gradient along a marine line of exploration of variable magnetic headings, comprising the steps of:

(a) traversing the earth's surface along a marine line of exploration with a marine vessel towing first and second magnetometers spaced-apart along said line of exploration for measuring the intensity of the earth's magnetic field;

(b) simultaneously recording magnetic measurements from each of said first and second magnetometers as they traverse the line of exploration, a magnetic bias variation being introduced between said magnetic measurements as the magnetic heading of said towing vessel changes;

(c) subtracting the magnetic measurements from said magnetometers for corresponding earth coordinates to obtain a set of first magnetic gradient difference values corresponding to each coordinate point sampled;

(d) integrating said set of magnetic gradient difference values to obtain magnetic gradient variation values;

(e) equating the slope of said magnetic gradient variation values to the slope of the magnetic measurements from said first magnetometer to obtain a modified set of magnetic measurements for said first magnetometer;

(f) performing a least squares fit to values of said modified set of measurements from said first magnetometer and the magnetic measurements from said second magnetometer;

(g) adjusting intersection differences between said modified set of measurements from said first magnetometer and the magnetic measurements from said second magnetometer to obtain a magnetic bias variation between the magnetic measurements from said magnetometer;

(h) adjusting said magnetic measurements from said magnetometer to correct said measurements for said magnetic bias variation; and (i) subtracting said corrected magnetic measurements to determine the earth's horizontal magnetic gradient along said line of exploration.

3. A method for determining the earth's horizontal magnetic gradient along a marine line of exploration, comprising the steps of:

(a) traversing the earth's surface with a marine vessel towing a pair of magnetometers spaced-apart at near and far positions along a marine line of exploration of varying magnetic headings for measuring the intensity of the earth's magnetic field along said line of explorations, (b) simultaneously recording magnetic measurements from each of said near and far magnetometers as they traverse the line of exploration, a magnetic bias variation being introduced between said magnetic measurements as the magnetic heading of said towing vessel changes, (c) subtracting the magnetic measurements obtained from said near and far magnetometers at corresponding coordinates along said line of exploration to obtain first magnetic gradient measurements, (d) integrating said first magnetic gradient measurements to provide a diurnal variation, (e) adjusting the slope of said diurnal variation so that first and last coordinate points are equal, (f) subtracting said adjusted diurnal variation from the magnetic measurements of said far magnetometer to provide adjusted magnetic measurements for said far magnetometer, (g) determining the slope of said adjusted magnetic measurements, (h) equating the determined slope of said adjusted magnetic measurements with the slope of the recorded magnetic measurements from said far magnetometer, (i) repeating steps (c) through (h) for magnetic measurements with differing intersecting slopes, (j) performing a least squares fit to the magnetic measurements for the coordinates of said intersecting slopes, (k) adjusting the intersection differences from said least squares fit to determine a magnetic bias variation between the magnetic measurements from said near and said far magnetometer, (l) adjusting said magnetic measurements of said near and far magnetometers to correct said measurements for said magnetic bias variation, and (m) subtracting said corrected magnetic measurements to determine the earth's horizontal magnetic gradient along said line of exploration.

* * * * *

UNITED STATES PATENT AND TRADEMARK OFFICE
CERTIFICATE OF CORRECTION

PATENT NO.   :   4,739,262

DATED        :   April 19, 1988

INVENTOR(S)  :   James Michael Fleetwood

It is certified that error appears in the above-identified patent and that said Letters Patent is hereby corrected as shown below:

Column 1, line 23, "apporxoimately" should read --approximately--.

Column 3, line 23, "cooridnates" should read --coordinates--.

Column 4, line 15, "$D(X+S) = D(X+S) + D_T(X+S)$" should read:
--$D(X+S) = d(X+S) + d_T(X+S)$--.

Column 5, line 28, "=d(X2S)" should read -- $d(X+2S)$ --.

Column 6, line 31, "$=B_2$" should read -- $-B_2$ --.

Signed and Sealed this

Thirtieth Day of August, 1988

Attest:

DONALD J. QUIGG

*Attesting Officer*       *Commissioner of Patents and Trademarks*